United States Patent
Granneman et al.

(10) Patent No.: US 10,837,107 B2
(45) Date of Patent: Nov. 17, 2020

(54) METHOD AND APPARATUS FOR CONTACTLESSLY ADVANCING SUBSTRATES

(75) Inventors: Ernst Hendrik August Granneman, Hilversum (NL); Vladimir Kuznetsov, Utrecht (NL)

(73) Assignee: ASM INTERNATIONAL N.V., Almere (NL)

( * ) Notice: Subject to any disclaimer, the term of this patent is extended or adjusted under 35 U.S.C. 154(b) by 932 days.

(21) Appl. No.: 13/808,392

(22) PCT Filed: Jul. 6, 2011

(86) PCT No.: PCT/NL2011/050483
§ 371 (c)(1),
(2), (4) Date: Apr. 15, 2013

(87) PCT Pub. No.: WO2012/005577
PCT Pub. Date: Jan. 12, 2012

(65) Prior Publication Data
US 2013/0199448 A1    Aug. 8, 2013

(30) Foreign Application Priority Data
Jul. 7, 2010  (NL) ..................................... 2005049

(51) Int. Cl.
*C23C 16/455*    (2006.01)
*C23C 16/54*    (2006.01)
(Continued)

(52) U.S. Cl.
CPC ............ *C23C 16/455* (2013.01); *B65G 51/02* (2013.01); *B65G 51/03* (2013.01);
(Continued)

(58) Field of Classification Search
CPC .............. C23C 16/455; C23C 16/4412; C23C 16/45557; C23C 16/54; C23C 16/45551; B65G 51/02; B65G 51/03; H01L 21/67784
(Continued)

(56) References Cited

U.S. PATENT DOCUMENTS

| 4,622,918 A | 11/1986 | Bok |
| 4,868,687 A | 9/1989 | Penn et al. |

(Continued)

FOREIGN PATENT DOCUMENTS

| WO | 85/04071 A1 | 9/1985 |
| WO | WO 8504071 A * | 9/1985 |

(Continued)

OTHER PUBLICATIONS

Chinese Search Report issued for CN Patent Application No. 201180042408.X, English translation only, 2 pages.

*Primary Examiner* — Michael P Wieczorek
*Assistant Examiner* — Michael G Miller
(74) *Attorney, Agent, or Firm* — Preti Flaherty Beliveau & Pachios LLP

(57) ABSTRACT

A method of contactlessly advancing a substrate (140), comprising: —providing a process tunnel (102), extending in a longitudinal direction and bounded by at least a first (120) and a second (134) wall; —providing first and second gas bearings (124, 134) by providing substantially laterally flowing gas alongside the first and second walls respectively; —bringing about a first longitudinal division of the process tunnel into a plurality of pressure segments (116), wherein the gas bearings (124, 34) in a pressure segment have an average gas pressure that is different from an average gas pressure of the gas bearings in an adjacent pressure segment; —providing a substrate (140) in between
(Continued)

the first wall (120) and the second wall (130); and 1—allowing differences in average gas pressure between adjacent pressure segments (116) to drive the substrate along the longitudinal direction of the process tunnel.

8 Claims, 3 Drawing Sheets

(51) Int. Cl.
      *C23C 16/44*         (2006.01)
      *H01L 21/677*      (2006.01)
      *B65G 51/03*       (2006.01)
      *B65G 51/02*       (2006.01)

(52) U.S. Cl.
      CPC .... *C23C 16/4412* (2013.01); *C23C 16/45551* (2013.01); *C23C 16/45557* (2013.01); *C23C 16/54* (2013.01); *H01L 21/67784* (2013.01)

(58) Field of Classification Search
      USPC .......................................... 427/248.1–255.7
      See application file for complete search history.

(56)              References Cited

U.S. PATENT DOCUMENTS

| | | |
|---|---|---|
| 9,238,867 B2 | 1/2016 | Granneman et al. |
| 2009/0081885 A1 | 3/2009 | Levy et al. |
| 2009/0291209 A1 | 11/2009 | Granneman et al. |

FOREIGN PATENT DOCUMENTS

| | | | |
|---|---|---|---|
| WO | 2009/142487 A1 | 11/2009 | |
| WO | WO 2009142487 A1 * | 11/2009 | ....... C23C 16/45551 |

* cited by examiner

METHOD AND APPARATUS FOR CONTACTLESSLY ADVANCING SUBSTRATES

FIELD OF THE INVENTION

The present invention relates to the field of semiconductor processing, and more in particular to a method for contactlessly supporting and advancing semiconductor substrates through a processing environment, and to an apparatus implementing said method.

BACKGROUND

International patent application WO 2009/142,487 (Granneman et al.) discloses an atomic layer deposition (ALD) apparatus for contactlessly processing semiconductor wafers in a continuous fashion. The apparatus includes a downwardly sloping process tunnel, extending in a transport direction and bounded by at least two tunnel walls. Both walls are provided with a plurality of gas injection channels, so as to provide for opposite gas bearings in between which a substrate may be floatingly accommodated. Viewed in the transport direction, the gas injection channels in at least one of the walls are successively connected to a first precursor gas source, a purge gas source, a second precursor gas source and a purge gas source respectively, so as to create a series of ALD-segments that, in use, comprise successive zones containing a first precursor gas, a purge gas, a second precursor gas and a purge gas, respectively. To propel a substrate accommodated between the gas bearings in the transport direction, the process tunnel is at least partly provided with a downward slope that enables gravity to drive the substrate through the successive ALD-segments. As the substrate passes through the ALD-segments a film is deposited thereon.

Although a process tunnel that is tilted relative to the horizontal may conveniently and reliably determine the velocity of a substrate, adapting that velocity would involves changing the tilt angle of the tunnel. This may call for an accurate tilt mechanism, which may complicate the design of the apparatus and raise its production and maintenance costs. Alternatively, the tilt of the process tunnel may be adjusted manually (for example by replacing props that support the process tunnel along its length), which would be rather labor intensive.

It is therefore an object of the present invention to provide for an alternative method of contactlessly propelling a floatingly supported substrate through a process tunnel, and for an alternative semiconductor processing apparatus that implements said method.

SUMMARY OF THE INVENTION

One aspect of the present invention is directed to a method of contactlessly advancing a substrate. The method may include providing a process tunnel, extending in a longitudinal direction and bounded by at least a first and a second wall, said walls being mutually parallel and spaced apart so as to allow a substantially flat substrate, oriented parallel to the walls, to be accommodated therebetween. The method may also include providing a first gas bearing by providing substantially laterally flowing gas alongside the first wall, and providing a second gas bearing by providing substantially laterally flowing gas alongside the second wall. The method may further include bringing about a first longitudinal division of the process tunnel into a plurality of pressure segments, wherein the first and second gas bearings in a pressure segment have an average gas pressure that is different from an average gas pressure of the first and second gas bearings in an adjacent pressure segment. In addition, the method may include providing a substrate in between the first wall and the second wall, such that it is floatingly accommodated between the first and second gas bearings, and allowing differences in average gas pressure between adjacent pressure segments to drive the substrate along the longitudinal direction of the process tunnel.

Another aspect of the present invention is directed to a substrate processing apparatus. The apparatus may include a process tunnel, extending in a longitudinal direction and bounded by at least a first and a second wall, said walls being mutually parallel and spaced apart so as to allow a substantially flat substrate, oriented parallel to the walls, to be accommodated there between. The apparatus may further include a plurality of gas injection channels, provided in both the first and the second tunnel wall, wherein the gas injection channels in the first tunnel wall are configured to provide for a first gas bearing, while the gas injection channels in the second tunnel wall are configured to provide for a second gas bearing, said gas bearings being configured to floatingly support and accommodate said substrate there between. The process tunnel may be divided into a plurality of pressure segments according to a first longitudinal division, and the gas injection channels associated with a certain pressure segment may be configured to inject gas at an average gas pressure that is different from an average gas pressure at which gas injection channel associated with an adjacent pressure segment are configured to inject gas.

The method and apparatus according to the present invention employ a first and a second gas bearing between which a substrate may be floatingly accommodated. The first and second gas bearings may generally be thought of as dynamic gas cushions that cover the first and second walls, respectively. Although they extend in the longitudinal direction of the process tunnel, the gases that make up each gas bearing flow in a substantially lateral direction. That is to say that at least the average velocity of gas making up a certain longitudinal portion of a gas bearing has a component in the lateral direction of the process tunnel that is larger than a component in the longitudinal direction of the process tunnel. The reasons for the substantially lateral direction of the gas flows will be elucidated below.

The process tunnel is longitudinally divided into a plurality of pressure segments. Adjacent pressure segments differ in the average gas pressure of their gas bearings. That is to say, the average static pressure of the combined first and second gas bearings in one pressure segment differs from the average static pressure of the combined first and second gas bearings in an adjacent pressure segment. As a result there exists a pressure differential between adjacent pressure segments, and hence along the length of the process tunnel. A substrate accommodated between the gas bearings will experience this pressure differential, and be propelled in the direction thereof.

From a physical point of view, the force propelling the substrate has two components. A first component results from the pressure difference across the laterally extending edges of the substrate, i.e. across its leading edge and its trailing edge. A second component results from viscous forces acting on the main surfaces of the substrate: the pressure differential in the process tunnel causes the gas of the gas bearings to flow in the longitudinal direction of the process tunnel, which in turn effects a forward (i.e. directed in the direction of the pressure differential) viscous drag force on the substrate. Once the substrate is moving, however, it will also experience a backward viscous drag force. When the three force components are in equilibrium and cancel each other out, the substrate maintains a constant velocity. Below, in the detailed description, the aforementioned force components will be discussed somewhat further with reference to a mathematical model.

The pressure differential that governs the velocity of the substrate may be changed by changing the pressure differences between the adjacent pressure segments. In the apparatus according to the present invention, the pressure within the gas bearings of a pressure segment may be adapted, easily and accurately, by controlling the pressure at which the respective gas injection channels inject gas into the process tunnel. In typical embodiments of the apparatus, such control may be effected by means of conventional controllable gas pressure regulators that may be associated with the gas injection channels and/or gas sources to which they are connected.

Although the gas of the dynamic gas bearings may have a velocity component in the longitudinal direction of the process tunnel, it must be stressed that the gas flows in a substantially lateral direction. I.e. the longitudinal velocity component is, at least on average, smaller than the lateral velocity component.

Indeed, it is known in the art to propel a floatingly supported substrate by means of a gas flow. GB 1,268,913, for example, discloses a pneumatic semiconductor wafer transport system. The transport system comprises a duct that is configured to receive an article, e.g. a semiconductor wafer, for transport there through. The duct has its bottom wall formed of a porous material through which a gas may be blown in order to produce a gas film on which the article may be floatingly suspended. The transport system further comprises means for effecting a gas pressure differential in the longitudinal direction of the duct. In effect, these means generate a gas flow that streams/blows through the duct and that drags any floatingly supported article located therein along with it. Although the transport system of GB'913 may in itself work satisfactorily, it will be clear that the longitudinal gas stream used to advance the article in GB'913 is incompatible with an atomic layer deposition processing environment in which mutually reactive, laterally extending gas flows make up the gas bearing (cf. WO 2009/142,487, or the detailed description below). A substantially longitudinal, substrate-propelling gas stream would distort the lateral reactant gas flows, lead to their mixing and hence to undesired and uncontrollable chemical vapor deposition.—To avoid such effects, the method according to the present invention may preferably entail ensuring that an average longitudinal velocity component of first and second gas bearing gas within a pressure segment is no larger than 20% of the average lateral velocity component of said gas in said pressure segment.

Another advantage of lateral gas flows as used by the present invention is that they may enable the formation of a stiff gas bearing that allows for good control over the motion of the substrate. They may in particular help to laterally stabilize the substrate as it travels through the process tunnel, so as to avoid collisions with lateral tunnel walls. Lateral stabilization of a substrate with the aid of lateral gas flows is described in more detail in co-pending patent application NL2003836 in the name of Levitech B. V., and is not elaborated upon in the present text. The effect is mentioned here merely to clarify that the advantageous use of substantially laterally flowing gas bearings is not limited to the field of atomic layer deposition, but may also be applied to other substrate processing treatments, such as for example annealing.

In one embodiment of the present invention, the average gas pressures in at least three consecutive pressure segments may be set such that—viewed in the longitudinal direction—the average pressure increases or decreases monotonically. Such an embodiment allows for uni-directional transport of substrates through the process tunnel. It is possible to change the direction of the pressure differential over said segments over time, so as to effectively reverse the transport direction of substrates, and to provide for bi-directional transport of substrates.

In an embodiment of the method according to the present invention, the average gas pressure in a number of consecutive pressure segments may be set such that a substrate experiences a substantially constant pressure differential as it travels through these pressure segments. As will be clarified below, the substantially constant pressure differential across the substrate may typically ensure a substantially constant substrate velocity. The phrase 'substantially constant pressure differential' may be construed to mean that any instantaneously experienced pressure differential differs by no more than 35%, and preferably no more than 20%, from the average pressure differential experienced during traversal of the respective pressure segments.

A distinct characteristic of the presently disclosed 'pressure-drive' method is that a longitudinal pressure differential in the process tunnel is distributed over successively arranged substrates. Assume, for example, that a longitudinal process tunnel segment features a pressure differential $\Delta P_1$. In case the process tunnel segment snugly accommodates a single substrate, this substrate will experience a pressure differential close to $\Delta P_1$. This is because the substrate forms the only major flow obstruction in the process tunnel segment. However, in case the process tunnel segment accommodates two successively arranged substrates, each substrate will merely experience a pressure differential close to ½ $\Delta P_1$. The overall pressure differential is thus distributed over different substrates. Since maintaining a constant substrate velocity may typically require a constant pressure differential across the substrate, maintaining a constant substrate velocity throughout a series of consecutive pressure segments may require that the average gas pressure in each of these pressure segments is set in dependence of the number of substrates accommodated therein (i.e. the substrate density).

In yet another embodiment of the method according to the present invention, the average gas pressures in a number of consecutive pressure segments are set such that the substrate experiences a pressure differential in the range of 0-100 Pa, and more preferably 0-50 Pa, as it travels through these pressure segments.

A substrate such as a semiconductor wafer may typically have a small mass and a correspondingly small inertia. At the same time, the fact that it is floatingly supported in between two gas bearings may advantageously ensure that only little friction has to be overcome to set and keep it in motion. Accordingly, only a small pressure differential across a substrate may be required to impart a desired velocity to the substrate. For most applications, a pressure differential below 100 Pa (i.e. 1 mbar) may be sufficient for practical purposes.

In one embodiment of the method according to the present invention, at least one pressure segment has a longitudinal dimension or length sufficient to accommodate at least two successively arranged substrates. In another embodiment of the method according to the present invention, a longitudinal dimension or length of at least one pressure segment is equal to or smaller than a longitudinal dimension of the substrate.

The division of the process tunnel into pressure segments may be as fine as desired. The more independently controllable pressure segments per unit of process tunnel length, the more precise the control that may be exercised over the motion of an individual substrate. If highly accurate control is desired, e.g. to briefly accelerate or decelerate a certain substrate in a portion of the process tunnel, a longitudinal dimension or length of at least one pressure segment may be chosen equal to or smaller than a longitudinal dimension of a substrate. A fine division comprising many pressure segments, however, may be relatively costly since control equipment for each individual pressure segment may be required. It may therefore be preferable to choose the length of a pressure segment such that it may accommodate at least two successively arranged, e.g. 2-10, substrates. It is possible to combine both options in a single embodiment. The process tunnel may for example include a number of consecutive, relatively long pressure segments, followed and/or preceded by a number of consecutive, relatively short pressure segments.

Although the method according to the present invention may be used as the sole mechanism for propelling a substrates through the process tunnel, it may also be used in combination with other, in particular contactless substrate propulsion mechanisms. Such supplementary methods of propelling a substrate may include (a) propulsion by directed gas streams effected through gas injection channels that are placed at an angle relative to the transport direction such that the injected gas streams have a tangential component in the transport direction, (b) propulsion by electric forces and/or magnetic forces, and (c) propulsion by gravity, which may be effected by inclining the entire process tunnel, or a portion thereof, with respect to the horizontal to provide it with a downward slope. Option (c) has been discussed in detail in the aforementioned (published) international patent application WO 2009/142,487. In a favorable embodiment that combines the 'pressure-drive' according to the present invention with the 'gravity-drive' according to WO'487, an at least partly sloping process tunnel may be used to set a base equilibrium velocity of the substrates, while the pressure of the gas bearings may vary along the longitudinal direction of the process tunnel to fine-tune this velocity. Such an embodiment allows for simple and quick adjustments of equilibrium velocity, for example in response to changes in the (viscosity of the) employed process gases, process temperature(s) or thickness of the substrates, and no longer demands adjustment of the inclination of possibly the entire process tunnel.

The 'pressure drive' method of propelling substrates through a process tunnel according to the present invention may further be combined with a variety of substrate treatments. These treatments may typically involve the use of the gas of the gas bearings for supplying process materials/chemical compounds and/or for transferring heat.

In one embodiment, the method of propelling the substrate may be combined with atomic layer deposition (ALD). The method may then include bringing about a second longitudinal division of the process tunnel into a plurality of ALD-segments, wherein at least one of the first and the second gas bearings in each ALD-segment comprises at least four laterally extending gas zones that successively contain a first precursor gas, a purge gas, a second precursor gas and a purge gas, respectively, such that the substrate, during movement through the process tunnel along the longitudinal direction, is subjected to the gases in the successive gas zones, and an atomic layer is deposited onto the substrate when it passes by all at least four zones of a single ALD-segment.

In another embodiment, the method may include subjecting the substrate to a heat or annealing treatment as it travels through at least a (longitudinal) portion of the process tunnel. For the purpose of annealing the substrate, the temperature of the gas bearings in the portion of the process tunnel employed for the annealing treatment may be set to a suitable annealing temperature, e.g. a temperature in the range of 350-1000° C. One skilled in the art will appreciate that the length of the tunnel portion used for annealing and the temperature of the gas bearings therein may both be matched with the intended substrate velocity to deliver a desired thermal budget. The method may further include selecting the chemical composition of the gases used for the first and/or second gas bearings. The gases of the gas bearings may, for example, be inert (in particular with respect to the substrate) such that they are configured to merely transfer heat. Alternatively, the chemical composition of at least one of the gas bearings may be chosen to include a suitable process gas, such as for example (i) oxygen, for carrying out an oxidation treatment; (ii) ammonia ($NH_3$), for carrying out a nitridation treatment; (iii) "forming gas", e.g. a mixture of hydrogen gas ($H_2$) and nitrogen gas ($N_2$), for passivating a substrate surface layer; or (iv) a dopant source such as a phosphorus (P) or boron (B) comprising compound (e.g. $PH_3$ or $B_2H_6$), for doping a semiconductor substrate.

Although the above-mentioned features of the present invention have been elucidated with reference to embodiments of the method according to the present invention, it is understood that they are, mutatis mutandis, equally applicable to the apparatus according to the present invention, which apparatus is configured to implement the method.

The above-mentioned and other features and advantages of the invention will be more fully understood from the following detailed description of certain embodiments of the invention, taken together with the accompanying drawings, which are meant to illustrate and not to limit the invention.

DETAILED DESCRIPTION

Figure 1:
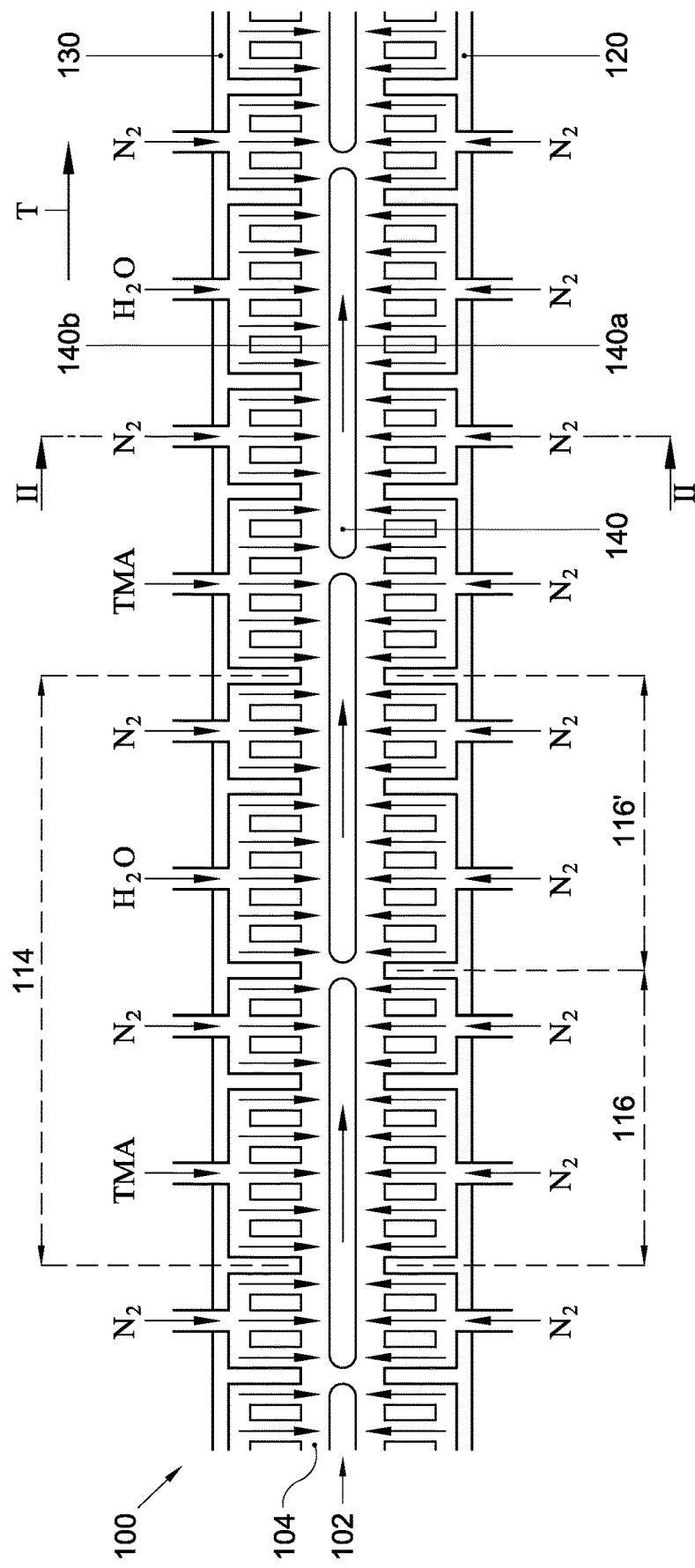
FIG. 1 is a diagrammatic longitudinal cross-sectional view of a portion of an exemplary embodiment of an apparatus according to the present invention.

An exemplary embodiment of an apparatus according to the present invention, which implements the method according to the present invention, will be described below with reference to FIGS. 1-3. The exemplary embodiment is set up as a spatial atomic layer deposition (ALD) apparatus. It is understood, however, that the scope of application of the apparatus and the method according to the present invention is not limited to the field of atomic layer deposition. The apparatus and method may be applied for the purpose of performing different substrate processing treatments, such as annealing.

The disclosed apparatus 100 may include a process tunnel 102 through which a substrate 140, e.g. a silicon wafer, preferably as part of a train of substrates, may be conveyed in a linear manner. That is, the substrate 140 may be inserted into the process tunnel 102 at an entrance thereof to be uni-directionally conveyed to an exit. Alternatively, the process tunnel 102 may have a dead end and the substrate 140 may undergo a bi-directional motion from an entrance of the process tunnel, towards the dead end, and back to the entrance. Such an alternative bi-directional system may be preferred if an apparatus with a relatively small footprint is desired. Although the process tunnel 102 itself may be rectilinear, such need not necessarily be the case.

The process tunnel 102 may include four walls: an upper wall 130, a lower wall 120, and two lateral or side walls 108. The upper wall 130 and the lower wall 120 may be oriented horizontally or at an angle relative to the horizontal, mutually parallel and be spaced apart slightly, e.g. 0.5-1 mm, such that a substantially flat or planar substrate 140, having a thickness of for example 0.1-1 mm and oriented parallel to the upper and lower walls 130, 120, may be accommodated there between without touching them. The lateral walls 108, which may be oriented substantially vertically and mutually parallel, may interconnect the upper wall 130 and the lower wall 120 at their lateral sides. The lateral walls 108 may be spaced apart by a distance somewhat larger than a width of a substrate 140 to be processed, e.g. its width plus 0.5-3 mm. Accordingly, the walls 108, 120, 130 of the process tunnel 102 may define and bound an elongate process tunnel space 104 having a relatively small volume per unit of tunnel length, and capable of snugly accommodating one or more substrates 140 that are successively arranged in the longitudinal direction of the tunnel.

Both the upper tunnel wall 130 and the lower tunnel wall 120 may be provided with a plurality of gas injection channels 132, 122. The gas injection channels 132, 122 in either wall 130, 120 may be arranged as desired as long as at least a number of them is dispersed across the length of the tunnel 102. Gas injection channels 132, 122 may, for example, be disposed on the corners of an imaginary rectangular grid, e.g. a 25 mm×25 mm grid, such that gas injection channels are regularly distributed over an entire inner surface of a respective wall, both in the longitudinal and lateral direction thereof.

The gas injection channels 122, 132 may be connected to gas sources, preferably such that gas injection channels in the same tunnel wall 120, 130 and at the same longitudinal position thereof are connected to a gas source of a same gas or gas mixture. For ALD-purposes, the gas injection channels 122, 132 in at least one of the lower wall 120 and the upper wall 130 may, viewed in the transport direction T, be successively connected to a first precursor gas source, a purge gas source, a second precursor gas source and a purge gas source, so as to create a functional ALD-segment 114 that—in use—will comprise successive tunnel-wide gas zones including a first precursor gas, a purge gas, a second precursor gas and a purge gas, respectively. It is understood that one such an ALD-segment 114 corresponds to a single ALD-cycle. Accordingly, multiple ALD-segments 114 may be disposed in succession in the transport direction T to enable the deposition of a film of a desired thickness. Different ALD-segments 114 within a process tunnel 102 may, but need not, comprise the same combination of precursors. Differently composed ALD-segments 114 may for example be employed to enable the deposition of mixed films.

Whether opposing gas injection channels 122, 132, which share a same longitudinal position of the process tunnel but are situated in opposite tunnel walls 120, 130, are connected to gas sources of the same gas composition may depend on the desired configuration of the apparatus 100. In case double-sided deposition is desired, i.e. ALD treatment of both the upper surface 140b and lower surface 140a of a substrate 140 travelling through the process tunnel 102, opposing gas injection channels 122, 132 may be connected to the same gas source. Alternatively, in case only single-sided deposition is desired, i.e. ALD treatment of merely one of the upper surface 140b and lower surface 140a of a substrate 140 to be processed, gas injection channels 122, 132 in the tunnel wall 120, 130 facing the substrate surface to be treated may be alternatingly connected to a reactive and an inert gas source, while gas injection channels in the other tunnel wall may all be connected to an inert gas source.

Figure 2:
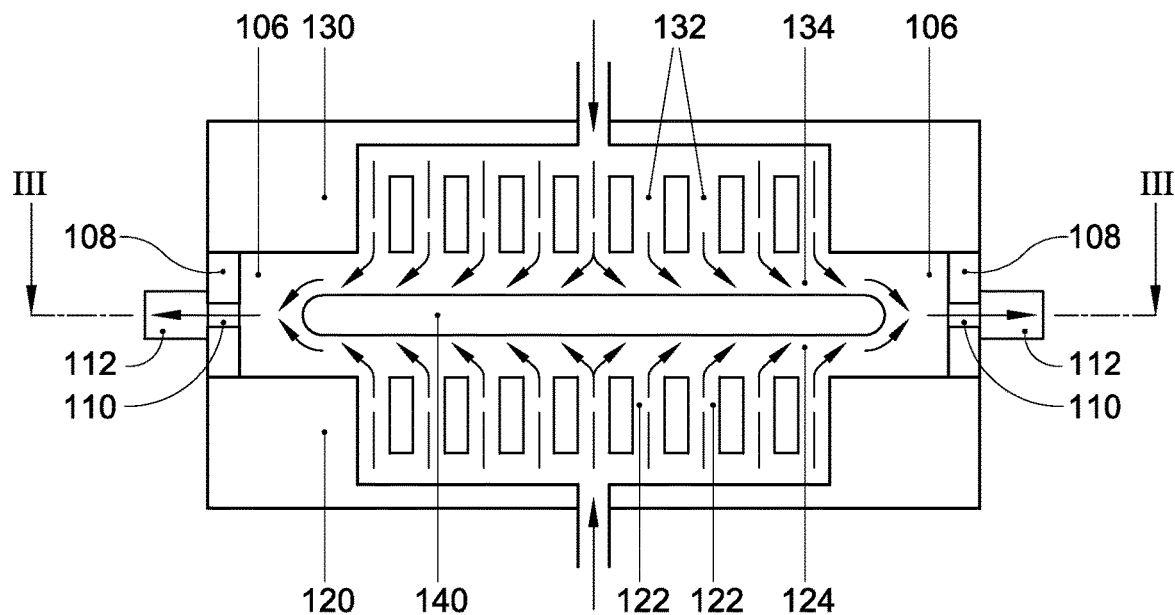
FIG. 2 is a diagrammatic lateral cross-sectional view of the apparatus shown in FIG. 1.
Figure 3:
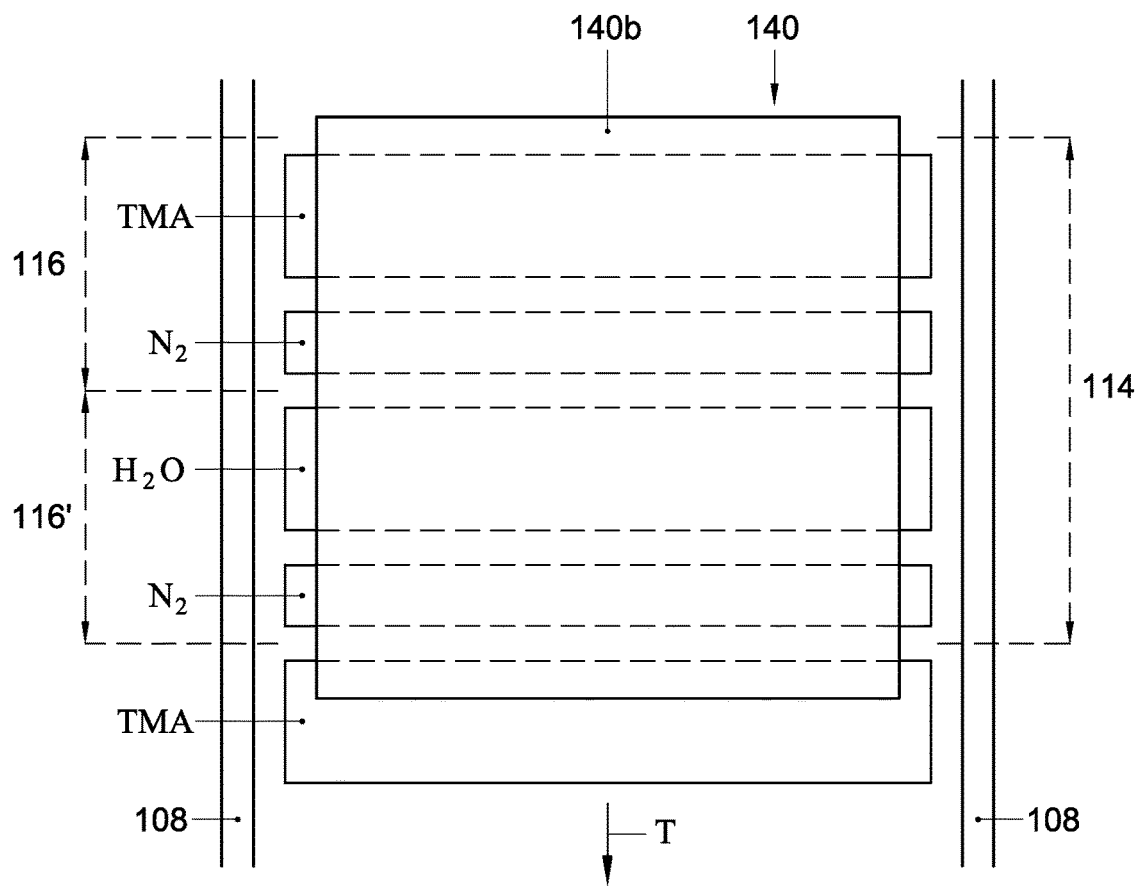
FIG. 3 is a diagrammatic cross-sectional plan view of a portion of the process tunnel shown in FIGS. 1-2.

In the exemplary embodiment of FIGS. 1-3, the gas injection channels 132 in the upper wall 130 are successively connected to a trimethylaluminum ($Al(CH_3)_3$, TMA) source, a nitrogen ($N_2$) source, a water ($H_2O$) source, and a nitrogen source, so as to form a series of identical ALD-segments 114 suitable for performing aluminum oxide ($Al_2O_3$) atomic layer deposition cycles. The gas injection channels 122 in the lower tunnel wall 120, in contrast, are all connected to a nitrogen source. Accordingly, the exemplary apparatus 100 is set up to maintain an upper depositing gas bearing 134 and a lower non-depositing gas bearing 124, together configured to perform single-sided deposition on a top surface 140b of a passing, floatingly supported substrate 140.

Each of the lateral walls 108 of the process tunnel 102 may, along its entire length or a portion thereof, be provided with a plurality of gas exhaust channels 110. The gas exhaust channels 110 may be spaced apart—preferably equidistantly—in the longitudinal direction of the process tunnel. The distance between two neighboring or successive gas exhaust channels 110 in a same lateral wall 108 may be related to a length of the substrates 140 to be processed (in this text, the 'length' of a rectangular substrate 140 is to be construed as the dimension of the substrate generally extending in the longitudinal direction of the process tunnel 120). A lateral wall portion the length of a substrate 140 may preferably comprise between approximately 5 and 20, and more preferably between 8 and 15, exhaust channels 110. The center-to-center distance between two successive gas exhaust channels 110 may be in the range of approximately 10-30 mm.

The gas exhaust channels 110 may be connected to and discharge into gas exhaust conduits 112 provided on the outside of the process tunnel 102. In case the apparatus 100 is set up to perform ALD, the exhaust gases may contain quantities of unreacted precursors. Accordingly, it may be undesirable to connect gas exhaust channels 110 associated with mutually different reactive gas zones to the same gas exhaust conduit 112 (which may unintentionally lead to chemical vapor deposition). Different gas exhaust conduits 112 may thus be provided for different precursors.

The general operation of the apparatus 100 may be described as follows. In use, both the gas injection channels 132, 122 in the upper wall 130 and the lower wall 120 inject gas into the process tunnel space 104. Each gas injection channel 122, 132 may inject the gas provided by the gas source to which it is connected. As the apparatus 100 is capable of operating at both atmospheric and non-atmospheric pressures, gas injection may take place at any suitable pressure. However, to render vacuum pumps superfluous, and to prevent any contaminating gas flows from the process tunnel environment into the tunnel space 104 (especially at the substrate entrance and exit sections), the tunnel space may preferably be kept at a pressure slightly above atmospheric pressure. Accordingly, gas injection may take place at a pressure a little above atmospheric pressure, e.g. at an overpressure on the order of several millibars. In case a lower pressure is maintained in the gas exhaust conduits 112, for example atmospheric pressure, the gas injected into the tunnel space 104 will naturally flow sideways, transverse to the longitudinal direction of the process tunnel and towards the gas exhaust channels 110 in the side walls 108 that provide access to the exhaust conduits 112.

In case a substrate 140 is present between the upper and lower walls 130, 120, the gas(es) injected into the tunnel space 104 by the gas injection channels 132 in the upper wall 130 may flow sideways between the upper wall and a top surface 140b of the substrate. These lateral gas flows across a top surface 140b of the substrate 140 effectively provide for an upper gas bearing 134. Likewise, the gas(es) injected into the tunnel space 104 by the gas injection channels 122 in the lower wall 120 will flow sideways between the lower wall and a lower surface 140a of the substrate 140. These lateral gas flows across a bottom surface 140a of the substrate 140 effectively provide for a lower gas bearing 124. The lower and upper gas bearings 124, 134 may together encompass and floatingly support the substrate 140.

As the substrate 140 moves through the process tunnel 102 its upper surface 140b is strip-wise subjected to the gases present in each of the successively arranged gas zones of the upper gas bearing 134 (cf. FIG. 3). Provided that the arrangements of the zones and the respective gases are chosen properly, traversal of one ALD-segment 114 may be equivalent to subjecting the substrate 140 to one atomic layer deposition cycle. Since the tunnel 102 may comprise as many ALD-segments 114 as desired, a film of arbitrary thickness may be grown on the substrate 140 during its crossing of the tunnel. The linear nature of the process tunnel 102 further enables a continuous stream of substrates 140 to be processed, thus delivering an atomic layer deposition apparatus 100 with an appreciable throughput capacity.

Now that the construction and general operation of the apparatus 100 has been described in some detail, attention is invited to the method for contactlessly advancing substrates 140 incorporated into the design thereof.

As mentioned, substrates 140 may be advanced by establishing a pressure differential in the longitudinal direction of the process tunnel 102. To this end, the process tunnel 102 may be divided into a plurality of pressure segments 116. In the embodiment of FIGS. 1-3, each pressure segment 116 extends over a longitudinal portion of the process tunnel 102 that comprises to two gas zones of an ALD-segment 114, namely a precursor (TMA or $H_2O$) gas zone and an adjacent purge gas ($N_2$) gas zone. It is understood, however, that the division of the process tunnel 102 into pressure segments 116 may generally be independent of the division in ALD-segments 104. That is to say that the division in pressure zones 116 need not have any particular relation to the division in ALD-segments 114. A single pressure segment may, for example, coincide with one or more ALD-segments 114 or a with longitudinal fractions thereof. Different pressure segments 116 need not have an identical length.

In use, each pressure segment 116 is characterized by an average gas pressure (gas pressure averaged over both gas bearings 124, 134) that differs from the average gas pressure in an adjacent pressure segment. The average gas pressure of the gas bearings 124, 134 in a pressure segment 116 may be controlled by controlling the (average) pressure at which gas is injected into the process tunnel space 104 via the gas injection channels 122, 132. To this end, the gas injection channels 122, 132 may be provided with gas pressure regulators.

Each of these gas pressure regulators may be manually controllable. Such an embodiment is economical, and practical in case after setting up the apparatus 100 no further adjustments are desired. Alternatively, the gas pressure regulators may be controllable via a central controller, e.g. a CPU. The central controller may in turn may be operably connected to an input terminal that allows an operator to select the desired injection gas pressures for individual gas injections channels 122, 132 or groups thereof, so as to enable convenient control over the average pressure in different pressure segments 116 and/or to change the division of the process tunnel 102 into pressure segments. Alternatively, or in addition, the central controller may run a program that dynamically controls the gas injection pressures for different pressure segments. Such dynamic control may for example be desired when the process tunnel 102 has a dead end, which may require the pressure differential across the tunnel to be reversed once the substrate reaches the dead end. In such an embodiment, the position of the substrate 140 may be detected by one or more contactless position sensors, e.g. photo-detectors, that communicate the position of the substrate to the central controller.

In the embodiment of FIGS. 1-3, the gas injection channels 122, 132 associated with a certain pressure segment 116 are statically configured to inject gas at an average gas pressure that is higher than an average gas pressure at which gas injection channels 122, 132 associated with an adjacent, downstream (as viewed in the transport direction T) pressure segment 116' are configured to inject gas. Thus, viewed in the transport direction T of the process tunnel 102, the average gas pressure of the gas bearings 124, 134 drops monotonically. This provides for a pressure differential across each of the substrates 140, which pressure differential drives them in the transport direction T.

In order to provide a handle on and some insight into the different parameters that affect the velocity of a substrate 140, a basic physical model of the situation is developed below. It will be appreciated by those skilled in the art that application of the model to practical embodiments of the apparatus 100 may require adaptations to be made to compensate for non-ideal conditions or circumstances that deviate from those outlined.

Figure 4:
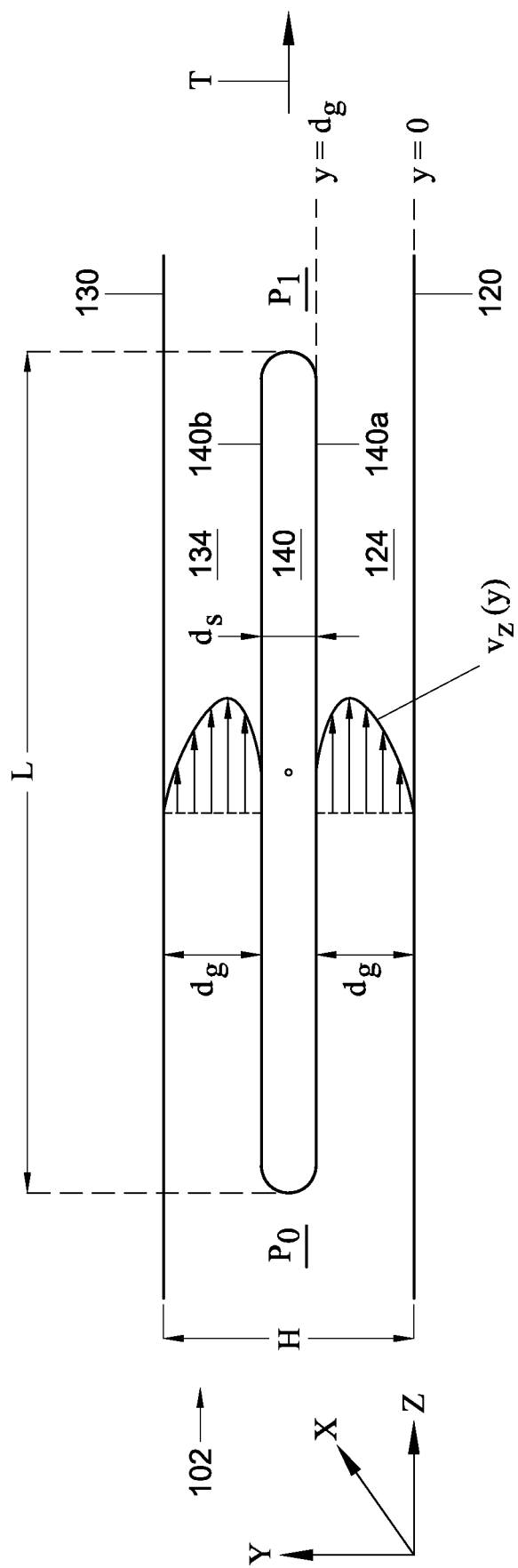
FIG. 4 is diagrammatic longitudinal cross-sectional view of a portion of a process tunnel, used to clarify a mathematical model put forward in the specification.

Referring now to FIG. 4, which shows a schematic longitudinal cross-sectional side view of a portion of a process tunnel 102. In the figure, any gas injection channels 122, 132 in the lower and upper tunnel walls 120, 130 have been omitted for reasons of drawing legibility. A substantially flat substrate 140 is located between the first, lower wall 120 and the second, upper wall 130 of the process tunnel 102. The substrate 140 is square (cf. FIG. 3) and has an edge length L and a thickness $d_s$. The lower wall 120 and the upper wall 130 of the process tunnel are mutually parallel, and the substrate's lower and upper surfaces 140a, 140b are substantially parallel to the lower wall 120 and the upper wall 130, respectively. It is assumed that the depicted situation is symmetrical, meaning that the substrate 140 is located precisely halfway between the tunnel walls 120, 130, and that the gas bearing 124 contacting the lower surface 140a is identical to the gas bearing 134 contacting the upper surface 140b. The process tunnel 102, and hence the walls 110, 120 and the substrate 130, extend horizontally.

Due to the maintenance of pressure segments (discussed above), there exists a negative pressure differential in the transport direction T of the process tunnel 102. Over the length L of the substrate 140, a gas pressure difference $\Delta P_z$ is equal to the downstream gas pressure $P_1$ minus the upstream gas pressure $P_0$, i.e. $\Delta P=P_1-P_0$. The pressure differential drives a flow of gas bearing gas in the longitudinal or z-direction. Although this longitudinal flow is relatively small compared to the lateral flow (perpendicular to the plane of the drawing), it is most relevant to the propulsion of the substrate 140. Both above and below the substrate 140, the longitudinal flow results in a velocity profile that obeys the equation (in spatial coordinates referring to the lower gas bearing):

$$v_z = \frac{\Delta P_z d_g^2}{2\eta L}\left(\frac{y}{d_g}\right)^2 + \left\{v_s - \frac{\Delta P_z d_g^2}{2\eta L}\right\}\left(\frac{y}{d_g}\right) \quad (1)$$

wherein $v_z$ denotes the gas velocity in the z-direction; $d_g$ denotes the gap or distance between the bottom and top surfaces 140a, 140b of the substrate and the first and second tunnel wall 120, 130, respectively; $\eta$ denotes a viscosity of the gas bearings 124, 134; y denotes the distance from the first, lower tunnel wall 120 (itself located at y=0); and $v_s$ denotes the substrate velocity in the y-direction. In practice, the viscosity $\eta$ may be approximated by a weighted average of the viscosities of the used purge and precursor gases, taking into account the relative lengths of the respective zones as weighting factors.

The net force on the substrate 140 in the longitudinal direction of the process tunnel, denoted $F_n$, may be said to be the resultant of two forces: a pressure force $F_p$ acting on the laterally extending leading and trailing edges of the substrate, and a viscous drag force $F_v$ acting on the bottom and top surfaces 140a, 140b of the substrate, such that $$F_n = F_p + F_v. \quad (2)$$

Using equation (1) the viscous drag force $F_v$, which results from the interaction between the surfaces 140a, 140b of the substrate 140 and the gas bearings 124, 134, respectively, may be expressed as $$F_v = 2A\left(-\eta \frac{dv_z}{dy}\bigg|_{y=d_g}\right) = -\Delta P_z d_g L - \frac{2\eta v_s A}{d_g} \quad (3)$$

wherein 2A denotes the combined surface area of the bottom and top surfaces 140a, 140b of the substrate (A being equal to $L^2$); and $dv_z/dy$ denotes a velocity gradient in either gas bearing 124, 134, which velocity gradient may be obtained by differentiating equation (1) with respect to y.

The pressure force $F_p$, which is simply equal to the pressure difference across the laterally extending trailing and leading edges of the substrate multiplied by the surface area of (a single one of) these edges, may be expressed as $$F_p = -d_s L \Delta P_z. \quad (4)$$

Combining equations (2), (3) and (4), and setting the net force $F_n$ to zero, yields the following expression for the equilibrium velocity $v_{s,eq}$ of the substrate:

$$v_{s,eq} = -\frac{d_g(d_s + d_g)\Delta P_z}{2\eta L} \quad (5)$$

The equilibrium velocity as expressed by equation (5) is the velocity that a substrate 140 will assume when the above-mentioned parameters are invariable along the length of the process tunnel.

The equilibrium velocity $v_{s,eq}$ establishes itself as follows. Once the substrate 140 is inserted into the process tunnel 102, it will partly obstruct it (cf. FIG. 2) and form a flow resistance. As a result, it will experience a pressure differential $\Delta P_z$ that amounts to a force $F_p$ (see eq. (4)) acting on its laterally extending leading and trailing edges to push it in the transport direction T. Viscous forces between its main surfaces 140a, 140b and the gas bearings 124, 134 in turn, induce a velocity-dependent viscous drag $F_n$ on the substrate 140 according to equation (2). When the sum $F_n$ of the pressure force $F_p$ and the drag force $F_v$ is positive, the substrate will speed up in the transport direction T, and vice versa. A net force $F_n$ propelling the substrate 140 in the transport direction T causes the drag on the substrate to increase until the drag force $F_v$ cancels out the pressure force $F_p$, from which point on the substrate's velocity remains constant at $v_{s,eq}$. Likewise, a net force $F_v$ dragging on the substrate will cause it to slow down until the viscous force $F_v$ cancels out the pressure force $F_p$ and the substrate assumes a constant velocity $v_{s,eq}$.

By way of numerical example, assume that the pressure differential $\Delta P_z$ across the substrate is −100 Pa, that the substrate has an edge length of 0.156 m and a thickness $d_s$ of 200 μm, and that the process tunnel has a height H of 500 μm such that there exists a gap $d_g$ of 150 μm on either side of the substrate. The gas bearings may be chosen to be of nitrogen ($N_2$), and be operated at a temperature of 20° C., giving them a viscosity $\eta$ of $1.88 \cdot 10^{-5}$ Pa·s. Substituting these values in equation (5) yields an equilibrium substrate velocity $v_{s,eq}$ of 0.90 m/s.

A highly practical characteristic of the method and apparatus according to the present invention is that the stiffness of the employed first and second gas bearings 124, 134 may be controlled independently of the desired (equilibrium) substrate velocity $v_s$. This is a consequence of the fact that the stiffness of the gas bearings 124, 134, which consist of substantially laterally flowing gas, is independent of longitudinal pressure drops between adjacent pressure segments 116, 116', but is instead proportional to $Q_x/d_g^3$, wherein $Q_x$ represents the lateral gas flow rate of gas flowing sideways between a substrate surface 140a, 140b and the respective adjacent tunnel wall 120, 130, and $d_g$ is the gap between the respective substrate surface 140a, 140b and the respective adjacent tunnel wall 120, 130.

Accordingly, the average gas pressure of the first and second gas bearings 124, 134 within a certain pressure segment 116 may be changed, e.g. increased or decreased, by simultaneously and correspondingly altering the local pressures in both the gas injection channels 122, 132 and the gas exhaust conduits 112 of the respective segment 116 without affecting either the lateral gas flow rate $Q_x$ or the gap $d_g$ between the substrate's surfaces 140a, 140b and the tunnel walls 120, 130. Although such a change in the average pressure in the pressure segment 116 will have an effect on the longitudinal pressure drop between said pressure segment 116 and an adjacent pressure segment 116', and thus on the (equilibrium) velocity $v_s$ of a substrate passing said adjacent pressure segments 116, 116' (cf. eq. (5)), there will be no effect on a lateral pressure drop $\Delta P_x$ within the gas bearings 124, 134 of either pressure segment 116, 116', and therefore no effect on the gas flow rate $Q_x$ or the stiffness of the gas bearings therein.

Alternatively, one may of course also do the opposite and change the lateral gas flow rate $Q_x$ in the first and second gas bearings 124, 134 of adjacent pressure segments 116, 116' by adjusting the lateral pressure drop $\Delta P_x$, and thus change the stiffness of the gas bearings. If the adjustment of the lateral pressure drop $\Delta P_x$ is performed uniformly for the adjacent pressure segments 116, 116', there will be no effect on the longitudinal pressure drop between the adjacent pressure segments, and thus no effect on the (equilibrium) velocity $v_s$ of a substrate 140 passing said pressure segments.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims. Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

LIST OF ELEMENTS 100 atomic layer deposition apparatus
102 process tunnel
104 process tunnel space
106 longitudinal gas channel adjacent side wall
108 lateral wall of process tunnel
110 gas exhaust channel
112 gas exhaust conduit
114 ALD-segment comprising four laterally extending gas zones
116 pressure segment
120 lower tunnel wall
122 gas injection channels in lower tunnel wall
124 lower gas bearing
130 upper tunnel wall
132 gas injection channels in upper tunnel wall
134 upper gas bearing
140 substrate
140a,b lower surface (a) or upper surface (b) of substrate
T transport direction of process tunnel
Mathematical Symbols
A surface area of substrate's lower/upper surface
$d_g$ width of gap between substrate's surface and first/second tunnel wall
$d_s$ substrate thickness
H height of process tunnel, i.e. spacing between first and second process tunnel walls
L edge length of (square) substrate
P gas bearing pressure
$\Delta P_z$ differential pressure across substrate in the longitudinal or z-direction
$Q_x$ gas flow rate in gas bearing in the lateral or x-direction $v_s$ velocity of the substrate
$v_{s,eq}$ equilibrium velocity of substrate
$v_z$ velocity of gas bearing in the indicated z-direction
x,y,z spatial coordinates for the coordinate system of FIG. 4
$\eta$ viscosity of gas bearing

We claim:
1. A method of contactlessly advancing substantially flat substrates in a transport direction, comprising:
providing a process tunnel, extending from an entrance to an exit in a longitudinal direction that is parallel to the transport direction, the process tunnel being bounded by at least a first and a second wall, said walls being mutually parallel and spaced apart so as to allow the substantially flat substrates, oriented parallel to the walls, to be accommodated there between, wherein the process tunnel has two opposite lateral sides and is bounded by two lateral side walls that extend in the longitudinal direction, wherein the process tunnel defines a lateral direction that extends parallel to the first and second walls and perpendicular to the longitudinal direction, wherein both the first and the second wall comprise a plurality of gas injection channels, the process tunnel being unobstructed along the entire length thereof, wherein the first and second walls extend horizontally and the longitudinal direction of the process tunnel extends horizontally;
providing at least a first precursor gas, a purge gas, and a second precursor gas;
selectively supplying the first precursor gas, the purge gas and the second precursor gas to the plurality of gas injection channels of the first wall to create a plurality of atomic layer deposition (ALD)-segments in the process tunnel, wherein each ALD-segment comprises at least four laterally extending gas zones that successively contain the first precursor gas, the purge gas, the second precursor gas and the purge gas, respectively, wherein in each laterally extending gas zone the gas flows substantially laterally towards the lateral sides of the process tunnel, whereby the ALD-segments of the plurality of ALD-segments are successively arranged in the longitudinal direction of the process tunnel, and wherein each ALD-segment is provided at a substantially constant pressure;
supplying a purge gas to the plurality of gas injection channels of the second wall whereby the purge gas flows substantially laterally towards the lateral sides of the process tunnel, or, alternatively,
selectively supplying the first precursor gas, the purge gas and the second precursor gas to the plurality of gas injection channels of the second wall to create a plurality of ALD-segments in the process tunnel, wherein each ALD-segment comprises at least four laterally extending gas zones that successively contain the first precursor gas, the purge gas, the second precursor gas and the purge gas, respectively, wherein in each laterally extending gas zone the gas flows substantially laterally towards the lateral sides of the process tunnel, whereby the ALD-segments of the plurality of ALD-segments are successively arranged in the longitudinal direction of the process tunnel;
successively supplying substrates into the process tunnel via the entrance to create a continuous stream of substrates within the process tunnel, whereby the first precursor gas, the purge gas and the second precursor gas supplied via gas injection channels of the first wall create a first gas bearing between each substrate and the first tunnel wall, wherein a stiffness of the first gas bearing is based on the substantially laterally flowing gas in the first gas bearings, whereby when purge gas is supplied via the plurality of gas injection channels of the second wall the purge gas creates a second gas bearing between each substrate and the second tunnel wall so that the substrates are floatingly supported and whereby, in the alternative when the first precursor gas, the purge gas and the second precursor gas, are supplied via the plurality of gas injection channels of the second wall the first precursor gas, the purge gas and the second precursor gas create a second gas bearing between each substrate and the second tunnel wall so that the substrates are floatingly supported, wherein a stiffness of the second gas bearing is based on the substantially laterally flowing gas in the second gas bearings;

wherein with the supplying of said gases:

an average gas pressure is created within both the first and the second gas bearing that, viewed in the transport direction of the process tunnel, drops monotonically along a first portion of the process tunnel thereby providing a pressure differential across each of the substrates which pressure differential drives the substrates in the transport direction, wherein said first portion in which the average pressure drops monotonically is long enough to accommodate a plurality of substrates wherein the pressure differential over each substrate is substantially constant at each longitudinal position of the substrate within said first portion of the process tunnel in which the average pressure drops monotonically so as to induce a substantial constant velocity to each substrate that is moving as part of the train of substrates within said first portion of the process tunnel, wherein said first portion of the process tunnel includes a plurality of subsequent ALD-segments, wherein within the said first portion of the process tunnel a corresponding plurality of ALD cycles is performed, wherein the average pressure in the subsequent ALD-segments in the first portion of the process tunnel at which the ALD cycle is performed monotonically drops when viewed from the entrance to the exit, and wherein the stiffness of the first gas bearing and the stiffness of the second gas bearing is independent of the longitudinal pressure drops in the average gas pressure;

wherein an ALD-layer is deposited on at least a first surface and optionally on both the first surface and a second, opposite surface of each substrate during movement of each substrate through each ALD-segment of the process tunnel along the transport direction, wherein an ALD-film composed of a stack of ALD-layers is formed during movement of each substrate from the entrance to the exit.

2. The method according to claim 1, wherein an average longitudinal velocity component of the gas of the first and second gas bearings is not larger than 20% of an average lateral velocity component of said gas.

3. The method according to claim 1, wherein the pressure differential ($\Delta P_z$) over each substrate accommodated within said first portion of the process tunnel in which the average pressure monotonically decreases is in the range of 0-100 Pa.

4. The method according to claim 1, further comprising: changing a difference in average gas pressure within said first portion of the process tunnel without altering a lateral gas flow rate ($Q_x$) of the substantially laterally flowing gas in the first and second gas bearings, so as to change a force with which the substrate is driven without altering a stiffness of the gas bearings.

5. The method according to claim 1, further comprising: changing a lateral gas flow rate ($Q_x$) of the substantially laterally flowing gas in the first and second gas bearings without altering a difference in average gas pressure along said first portion of the process tunnel, so as to change a stiffness of the gas bearings without altering a force with which the substrates are driven within said first portion of the process tunnel.

6. The method according to claim 1, further comprising: supplying in a second portion of the process tunnel having a second length, via the plurality of gas injection channels of the first wall and second wall, an inert purge gas or a process gas chosen from the group comprising: (i) oxygen, (ii) ammonia, (iii) hydrogen, and (iv) a phosphorus or boron comprising compound, supplying heat to the second portion of the process tunnel thereby subjecting the continuous stream of substrates moving through the second portion to an annealing treatment.

7. A method of contactlessly advancing substantially flat substrates in a transport direction during atomic layer deposition (ALD), comprising:

providing a process tunnel, extending from an entrance to an exit in a longitudinal direction that is parallel to the transport direction, the process tunnel being bounded by at least a first and a second wall, said walls being mutually parallel and spaced apart so as to allow the substantially flat substrates, oriented parallel to the walls, to be accommodated there between, wherein the process tunnel has two opposite lateral sides and is bounded by two lateral side walls that extend in the longitudinal direction, wherein the process tunnel defines a lateral direction that extends parallel to the first and second walls and perpendicular to the longitudinal direction, wherein both the first and the second wall comprise a plurality of gas injection channels, the process tunnel being unobstructed along the entire length thereof, wherein the first and second walls extend horizontally and the longitudinal direction of the process tunnel extends horizontally;

selectively supplying a first gas bearing by providing a first precursor gas, a purge gas and a second precursor gas to the plurality of gas injection channels of the first wall to create a plurality of ALD-segments in the process tunnel, wherein each ALD-segment comprises at least four laterally extending gas zones that successively contain the first precursor gas, the purge gas, the second precursor gas and the purge gas, respectively, wherein in each laterally extending gas zone the gas flows substantially laterally towards the lateral sides of the process tunnel, whereby the ALD-segments of the plurality of ALD-segments are successively arranged in the longitudinal direction of the process tunnel, wherein a stiffness of the first gas bearing is based on the substantially laterally flowing gas in the first gas bearings, and wherein each ALD-segment is provided at a substantially constant pressure;

supplying a second gas bearing by providing at least the purge gas to the plurality of gas injection channels of the second wall whereby the purge gas flows substantially laterally towards the lateral sides of the process tunnel, wherein a stiffness of the second gas bearing is based on the substantially laterally flowing gas in the second gas bearings;

successively supplying substrates into the process tunnel via the entrance to create a continuous stream of substrates within the process tunnel, whereby the first gas bearing and the second gas bearing floatingly support each substrate;

wherein with the supplying of said gases:
- an average gas pressure is created within both the first and the second gas bearing that, viewed in the transport direction of the process tunnel, drops monotonically along a first portion of the process tunnel thereby providing a pressure differential across each of the substrates which drives the substrates in the transport direction, wherein said first portion in which the average pressure drops monotonically is configured to accommodate a plurality of substrates wherein the pressure differential over each substrate is substantially constant at each longitudinal position of the substrate within said first portion of the process tunnel in which the average pressure drops monotonically so as to induce a substantial constant velocity to each substrate that is moving as part of the train of substrates within said first portion of the process tunnel, wherein said first portion of the process tunnel includes a plurality of subsequent ALD-segments, wherein within the said first portion of the process tunnel a corresponding plurality of ALD cycles is performed, wherein the average pressure in the subsequent ALD-segments in the first portion of the process tunnel at which the ALD cycle is performed monotonically drops when viewed from the entrance to the exit, and wherein the stiffness of the first gas bearing and the stiffness of the second gas bearing is independent of the longitudinal pressure drops in the average gas pressure;

wherein an ALD-layer is deposited on at least a first surface of each substrate during movement of each substrate through each ALD-segment of the process tunnel along the transport direction, wherein an ALD-film composed of a stack of ALD-layers is formed during movement of each substrate from the entrance to the exit.

8. The method of claim 7, wherein supplying the second gas bearing further comprising: selectively supplying the first precursor gas, the purge gas and the second precursor gas to the plurality of gas injection channels of the second wall to create a plurality of ALD-segments in the process tunnel, wherein each ALD-segment comprises at least four laterally extending gas zones that successively contain the first precursor gas, the purge gas, the second precursor gas and the purge gas, respectively, wherein in each laterally extending gas zone the gas flows substantially laterally towards the lateral sides of the process tunnel, whereby the ALD-segments of the plurality of ALD-segments are successively arranged in the longitudinal direction of the process tunnel, and wherein the ALD-layer is further deposited on a second surface opposite the first surface of the substrate during movement of each substrate through each ALD-segment of the process tunnel along the transport direction.

* * * * *